United States Patent [19]
Koyanagi

[11] Patent Number: 5,878,889
[45] Date of Patent: Mar. 9, 1999

[54] SEMICONDUCTOR WAFER CARRIER FEATURING EFFECTIVE REDUCTION OF AIRBORNE PARTICLES BECOME ATTACHED TO WAFERS

[75] Inventor: Takuya Koyanagi, Kumamoto, Japan

[73] Assignee: Nec Corporation, Tokyo, Japan

[21] Appl. No.: 786,928

[22] Filed: Jan. 23, 1997

[30] Foreign Application Priority Data

Jan. 23, 1996 [JP] Japan ................................. 8-009128

[51] Int. Cl.⁶ .................................................. B65D 73/02
[52] U.S. Cl. .............................. 206/711; 206/454; 211/41
[58] Field of Search ........................... 206/711, 710, 206/454, 449, 832, 833; 211/41

[56] References Cited

U.S. PATENT DOCUMENTS 5,255,783  10/1993  Goodman et al. ...................... 206/711
5,273,159  12/1993  Gregerson ............................... 206/711
5,586,658  12/1996  Nyseth ..................................... 206/711

*Primary Examiner*—Paul T. Sewell
*Assistant Examiner*—Nhan T. Lam
*Attorney, Agent, or Firm*—Foley & Lardner

[57] ABSTRACT

A wafer carrier for transporting a plurality of wafers includes a pair of end panels provided In parallel with each other at opposite sides of the wafer carrier. The wafer carrier further includes a wafer supporter for supporting the plurality of wafers. The wafer supporter has two opposite side walls in parallel with each other and extending in a direction normal to the pair of end panels. Each of the side walls has two end portions respectively secured to the two end panels. The wafer supporter has a plurality of grooves which are provided, at predetermined intervals, on an inner surface thereof in parallel with one another and In parallel with the two end panels. The grooves support corresponding semiconductor wafers at their peripherals. One groove, nearest to one of the two end panels, is separated from the one of the end panels by a distance selected to minimize the number of airborne particles which become attached to a surface of a wafer facing the end panel.

7 Claims, 3 Drawing Sheets

W = 4 mm
D = 10 mm

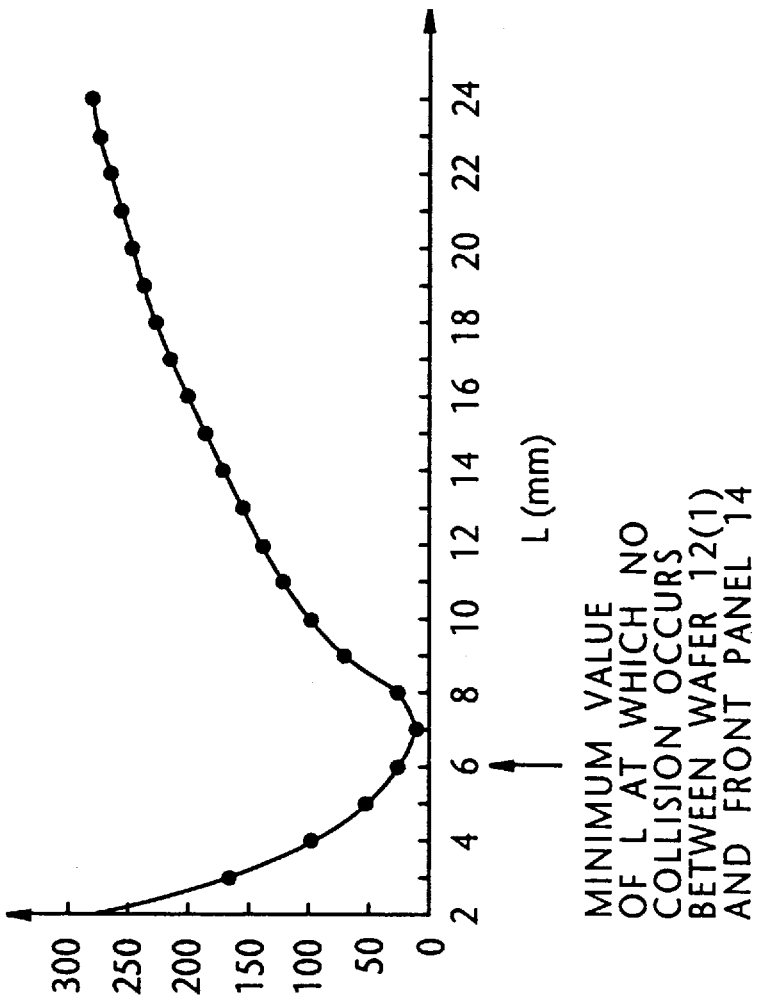

SEMICONDUCTOR WAFER CARRIER FEATURING EFFECTIVE REDUCTION OF AIRBORNE PARTICLES BECOME ATTACHED TO WAFERS

BACKGROUND OF THE INVENTION

1. Field of the invention

The present invention relates generally to an improved wafer carrier for use in carrying a plurality of semiconductor wafers in a wafer processing environment, and more specifically Lo a wafer carrier which can effectively reduce the number of airborne particles which become attached to or deposit on a surface of the wafer which faces one end panel or wall of the carrier.

2. Description of the Related Art

As is well known in the art, IC (integrated circuit) fabrication consists of a variety of processing steps that add, alter, and remove thin layers in the selected regions. During the wafer processing, it is necessary to transport a plurality of wafers using a wafer carrier from one wafer processing station to another. Many of the water processing sequences for integrated circuits are Implemented in a clean room. However, it is impossible to completely prevent airborne particles from becoming attached to the wafers.

A wafer carrier has usually a rectangular box-like structure with no top cover and is provided with a plurality of grooves so as to vertically support a plurality of wafers in parallel at predetermined intervals.

With a conventional wafer carrier, attention has been paid to accommodating as many wafers as possible without preventing any contact between two adjacent wafers. However, the outermost wafers in the wafer carrier are well spaced from the corresponding carrier front and rear panels. This is because the location of each outermost wafer is not important in increasing the wafer transportation efficiency.

Japanese Patent (JP) Application No. 3-143523 which was laid-open under publication No. 4-36724, discloses a wafer carrier which is made of quartz and which is used for immersing the wafers into a processing bath filled with hydrogen fluoride (HF). This arrangement is directed to overcoming the problem caused by a wafer-exposed type carrier and which is therefore not provided with any front and rear panels (and also any side panels). During the processing of wafers using hydrogen fluoride, microscopic particles are released from the carrier and accumulate especially on lower horizontally extending structure bars which form part of the carrier. After immersion, the wafers are washed using clean water while being retained in the same carrier.

When the wafer carrier is rapidly immersed into the cleaning water, the microscopic particles tend to be washed off the upper portions of the lower supporting bars and float upwardly toward the wafer surface. These microscopic particles thus tend to become attached to the wafers.

In order to reduce this drawback, the above mentioned JP Application 3-143523 proposes to provide, in place of the lower supporting bars, a pair of end panels each of which has the same height as the wafer and is arranged in parallel with the wafers which are vertically supported in the carrier. That is, the fine particles tend to accumulate on the upper edges of the front and rear panels and accordingly, when the carrier is quickly immersed into the water, the contaminants (viz., microscopic particles) swiftly reach the water surface without traveling in the vicinity of wafers. Thus, the contaminants can be removed together with surface water.

It is understood that the above mentioned related art is irrelevant to reducing airborne particles which become attached to the wafer surfaces during transport.

SUMMARY OF THE INVENTION

It is therefore an object of the present invention to provide a semiconductor wafer carrier which is able to attain effective reduction in airborne particles which objectionably become attached to the wafers carried therein.

One aspect of the present invention resides in a wafer carrier for transporting a plurality of wafers in a wafer processing environment. The wafer carrier includes a pair of end panels provided in parallel with each other at opposite sides of the wafer carrier. The wafer carrier further includes a wafer supporter for supporting the plurality of wafers. The wafer supporter has two opposite side walls which are parallel with each other and which extend in a direction normal to the pair of end panels. Each of the side walls having two end portions is respectively secured to tile two end panels to complete the wafer carrier. The wafer supporter has a plurality of grooves which are provided at predetermined intervals, on an inner surface thereof in parallel with one another and in parallel with the two end panels. The grooves upwardly support corresponding semiconductor wafers at their peripherals. One groove, nearest to one of the two end panels, is separated from the one of the end panels by a distance which minimizes the number of airborne particles which become attached to a surface of a wafer facing the end panel.

BRIEF DESCRIPTION OF THE DRAWINGS

The feature and advantages of the present invention will become more clearly appreciated from the following description taken in conduction with the accompanying drawings in which like members or elements are denoted by like reference numerals and in which;

FIG. 6 is a graph showing the number of airborne particles which become attached to one surface of a wafer relative to a distance between a front panel and the adjacent wafer.

DETAILED DESCRIPTION OF THE PREFERRED EMBODIMENTS

A preferred embodiment of the present invention will be described with reference to FIGS. 1–6.

Figure 1:
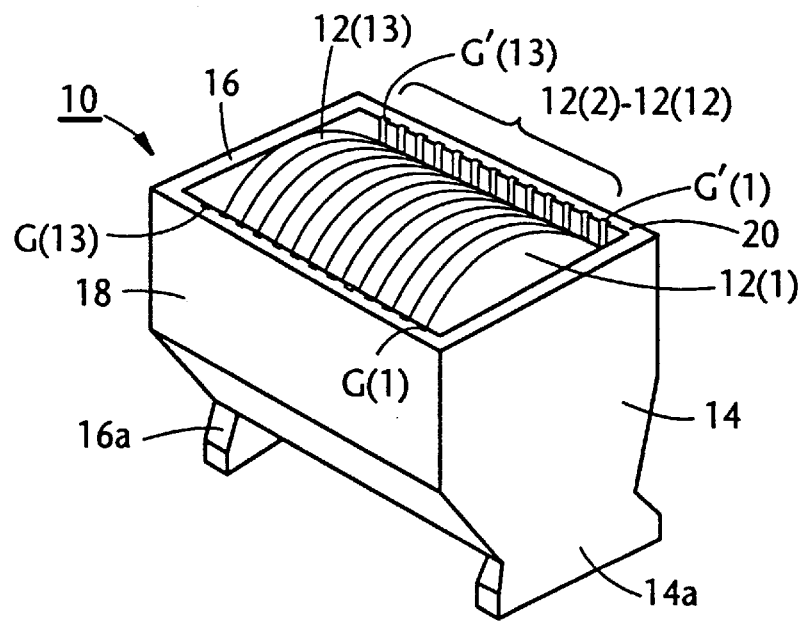
FIG. 1 is a schematic perspective of a wafer carrier to which the present invention is applicable.

FIG. 1 is a perspective view of a wafer carrier 10 which vertically supports therein a plurality of wafers (depicted by 12(1)–12(13)) in a parallel relationship. The wafer carrier 10 contains thirteen wafers in this particular case. It goes without saying that the present invention is in no way limited to the number of wafers transported by the wafer carrier 10.

As shown in FIG. 1, the wafer carrier 10 is comprised of a front and rear panels (viz., end panels) 14 and 16 in a direction essentially normal to the surface of each wafer. These panels 14 and 16 are respectively provided with leg portions 14a and 16a for stabilizing the carrier 10. The wafer carrier 10 further comprises side panels 18 and 20. It is assumed that the wafers 12(1)–12(13) are arranged with their IC forming surfaces facing toward the front panel 14.

Figure 2A:
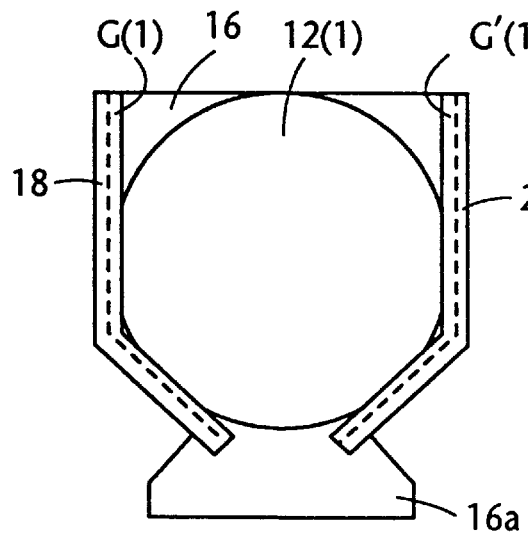
FIGS. 2A and 2B are cutaway front views of the wafer carrier of FIG. 1.

FIG. 2A is a front view wherein the front panel 14 is cut away. As best shown in FIG. 2A, the lower portion of the side panels 18 and 20 are respectively inwardly angled.

Returning to FIG. 1, each of the side panels 18 and 20 are provided with a plurality of grooves for loosely holding wafers 12(1)–12(13). More specifically, the side panel 18 has grooves G(1)–G(13), while the other side panel 20 has grooves G'(1)–G'(13). In FIG. 1, only the outermost grooves are depicted by G(1), G(13), G'(1), and G'(13) for the sake of simplifying the drawing.

The pair of grooves G(1) and G'(1) support the wafer 12(1). This also applies to the other pairs of grooves which support the respective wafers 12(2)–12(13). The grooves G(1) and G'(1) are respectively formed on the inner surfaces of the angled side panels 18 and 20 in a manner which extends from the top to the bottom as shown by dashed lines in FIG. 2. The remaining grooves are similarly formed on the side panels 18 and 20.

The above mentioned panels 14, 16, 18, and 20 are made of polypropylene (for example) and are integrally formed with each other using an injection molding technique (for example).

Figure 2B:
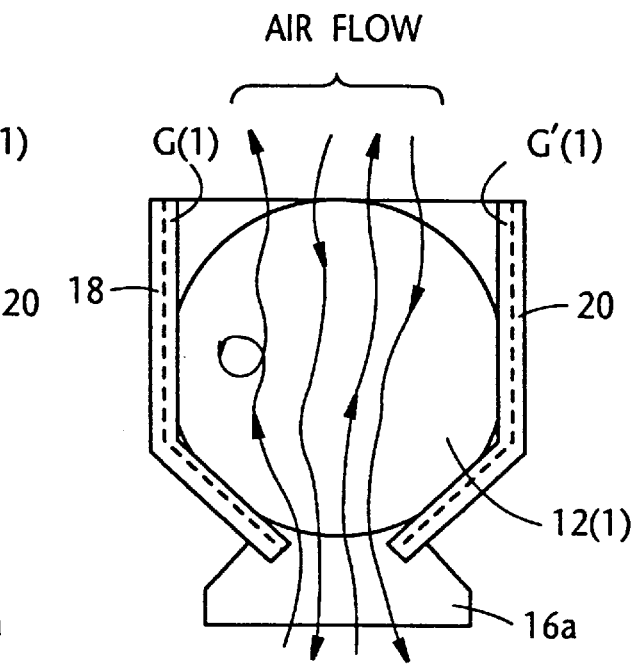

The bottom of the wafer carrier 10 open and accordingly, air can flow both upward and downward between the front panel 14 and the wafer 12(1) as schematically illustrated in FIG. 2B. Although, there exists similar air flow between the adjacent wafers and also between the rear panel and the wafer 12(13), the present Invention is not concerned with the air flow other than that shown in FIG. 2B which occurs between the rear panel and the wafer 12(13).

Figure 3:
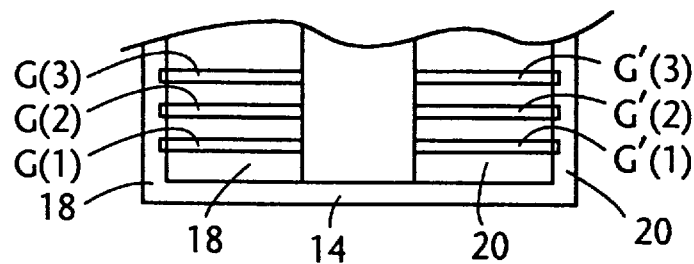
FIG. 3 is a plan view of the wafer carrier of FIG. 1.
Figure 4:
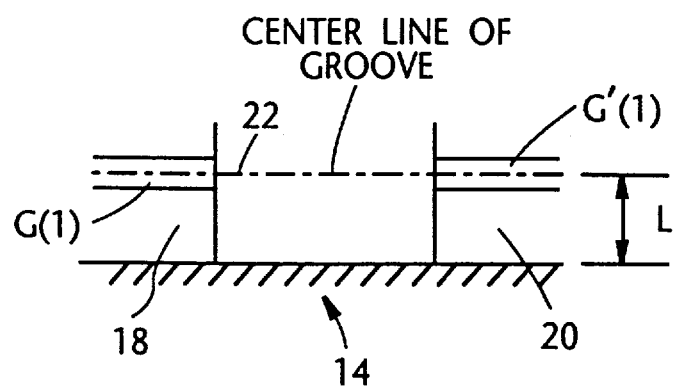
FIG. 4 is a diagram schematically showing part of the wafer carrier of FIG. 1, used for discussion of inventor's experiments.

FIG. 3 is a plan view of the wafer carrier 10 shown in FIG. 1 with the wafers removed. That is, FIG. 3 shows three pairs of grooves G(l)–G'(1) G(2)–G'(2), and G(3)–G'(3) formed on the inner surfaces of the side panels 18 and 20.

The inventor conducted an experiment described below in order to determine an optimum distance between the front panel 14 and the adjacent pair of grooves G(1) and G'(1) considering the air flows indicated in FIG. 2B. The optimum distance is a distance for minimizing the number of airborne particles attached to the IC forming surface of the wafer 12(1) while the wafers are retained in the carrier 10.

Figure 5:
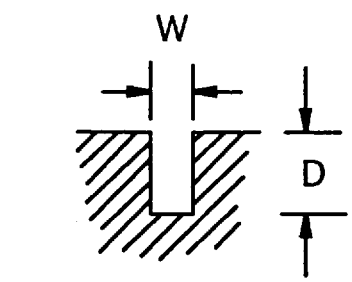
FIG. 5 is a cross-section of each of grooves formed in the wafer carrier of FIG. 1.

In the experiment, the distance (depicted by L in FIG. 4) between the inner surface of the front panel 14 and the center line of the groove G(1) (G(1)') for supporting the wafer 12(1), was varied from 2 mm to 24 mm at an interval of 1 mm. That is to say, twenty-three wafer carriers with the different Ls were prepared. The wafer carrier was a type for accommodating 8-Inch (about 200 mm) diameter wafers having a thickness of 0.725 mm. Each groove of the wafer carriers used In the experiment was 4 mm (for example) in width and 10 mm (for example) in depth as shown in FIG. 5. The width of each groove was sufficiently larger than the thickness of the wafer in order that the wafer was easily inserted into the carrier 10 even if the wafer became warped or distorted during the processing.

The wafer carriers with the different Ls were sequentially moved around for one hour in an environment where the cleanliness is about 10,000 particles/m$^3$ and wherein each particle was less than about 25 $\mu$m. The air In the room was air conditioned to a temperature of about 21° C. and about 45% relative humidity. Each time one wafer carrier had been moved around for one hour, the number of airborne particles attached to the IC forming surface of the wafer 12(1) was counted using a suitable microscope.

Beside the above mentioned experiment, a check was made to determine the minimum distance L which would prevent the wafer 12(1) from colliding against the front panel 14 even when the carrier 10 was moved around for more than one hour. This check was implemented by painting the upper portion of the Inner wall of the front panel 14 in order to detect any sign of collision. The inventor found that if the distance L was 6 mm then there was no possibility of a collision. The above mentioned collision check was carried out separately from the experiment examining the number of airborne particles.

Each groove of the wafer carrier had a section as shown in FIG. 5. However, the section of each groove is not limited thereto and, each groove may have a parabolic edge section, a "U"-shaped section (viz., having a rounded bottom), etc. by way of example. In the instant disclosure, the distance L represents a distance between the groove and the inner surface of the front panel 14.

The results of the particles attachment or deposition experiment are plotted in FIG. 6. As indicated, the number of airborne particles attached to the IC forming surface of the wafer 12(1) exhibits the minimum value at the distance L of about 7 mm. It is Important that this optimum value of L=7 mm is larger than the above mentioned distance L-=6 mm which is the minimum distance L for preventing a collision between the wafer 12(1) and the front panel 14.

It is surmised that as the distance L becomes narrower than L=7 mm, the air flowing through between the front panel 14 and the wafer 12(1) becomes faster and increases. Thus, in this instance, an increased amount of air gently blows the water's surface and accordingly the number of airborne particles which are liable to attach to the wafer's surface which faces the front panel 14, increases. It is further surmised that, on the other hand, as the distance L becomes larger than about 7 mm, a larger air space is created between the front panel 14 and the wafer 12(1) and thus, the number of airborne particles are liable to increase therebetween. Therefore, the larger the distance L over 7 mm, the more airborne particles are apt to attach to the IC forming surface of the wafer 12(1).

In the experiment mentioned above, 8-inch diameter wafer was utilized. However, the experiment results thus obtained can apply to a wafer whose diameter is larger than 8-inch. That is, the speed of air flow between the wafer and the front panel 14 may increase in proportion to the area of the wafer. Therefore, by way of example, if the present invention is applied to a wafer of 12-inch in diameter, it is predicted that the optimum distance L will be about 15 mm in that the surface area of the 12-inch wafer is 2.25 times greater than that of the 8-inch wafer. If a 12-inch diameter wafer has a thickness proportional to a ratio of the thickness of 8-inch diameter wafer to the diameter thereof, the thickness of the 12-inch diameter wafer is about 1.09 mm. This means that a 12-inch diameter wafer is sufficiently, loosely supported In the groove having 4 mm in width as in the case mentioned above.

In conclusion, when a given wafer of D-inch in diameter is used, the optimum distance L is expressed by the following equation.

$$\text{Optimum Distance } L = 7(\text{mm}) \times [(D(inch)/2)^2 16(\text{inch}^2)]$$

In the above, the distance between the front panel 14 and the wafer 12(1) has been described. However, the same discussion is applicable to the optimum distance between the wafer 12(13) and the rear panel 16 although the IC forming surface of the wafer 12(13) does not face the rear panel 16.

It should be understood that the foregoing description is only illustrative of the present invention and that various alternatives and modification can be devised by those skilled in the art without departing from its scope. Accordingly, the present invention, which embraces all such alternatives, modifications and variance is limited only the scope of the appended claims.

What is claimed:

1. A wafer carrier comprising:

an end walls;

a wafer support groove adjacent to the end wall; and a structure for attenuating deposition of airborne particles on a surface of an end-most wafer of a plurality of wafers supported in the wafer carrier, said structure comprising spacing means which separates the groove from the end wall by a distance given by:

$$L=7(mm)\times[(D(inch)/2)^2/16(inch^2)]$$

where D represents a diameter of the end-most wafer and L represents the distance between the groove and the end wall.

2. A wafer carrier comprising:

an end wall;

support means for supporting an end-most wafer of a plurality of wafers proximate said end wall; and means for attenuating deposition of airborne particles on a surface of the end-most wafer comprising a spacing which separates the support means from the end wall by a distance given by:

$$L=7(mm)\times[(D(inch)/2)^2/16(inch^2)]$$

where D represents a diameter of the end-most wafer and L represents the distance between said support means and said end wall.

3. An improved wafer carrier, comprising:

a first end panel and a second end panel provided in parallel with each other at opposite sides of said wafer carrier; and support means for supporting a plurality of wafers, said support means having two opposite ends which are respectively secured to said first and second end panels, said wafer support means having a plurality of grooves, in parallel with said first and second end panels, for providing support to said plurality of wafers, wherein the improvement comprises a structure wherein an end-most groove of said plurality of grooves adjacent to said first end panel is separated from said first end panel by a distance given by:

$$L=7(mm)\times[(D(inch)/2)^2/16(inch^2)]$$

where D represents a diameter of a wafer supported in said end-most groove and L represents the distance between said end-most groove and said first end panel.

4. A wafer carrier as claimed in claim 3, wherein said support means forms a top opening and a bottom opening wherein said openings extend between said first and second end panels.

5. A method of attenuating deposition of airborne particles on a surface of an end-most wafer of a plurality of wafers supported in a wafer carrier which includes an end wall and a wafer support groove adjacent to the end wall, comprising the step of spacing the groove from the end wall by a distance given by:

$$L=7(mm)\times[(D(inch)/2)^2/16(inch^2)]$$

where D represents a diameter of a wafer supported in the groove and L represents the distance between the groove and the end wall.

6. A device for carrying a plurality of semiconductor wafers, said device comprising:

a container having side panels, end panels, an open top of sufficient width to allow insertion of said wafers into and removal of said wafers from said container, and an open bottom of sufficient width to allow air to flow through said container and to prevent said wafers from passing through said container, wherein said open top and open bottom extend lengthwise between said end panels and extend widthwise between said side panels; and a plurality of rows of grooves formed in said side panels to support each of said plurality of wafers, wherein a first row of grooves of said plurality to support one of said plurality of wafers is formed adjacent to and at a predetermined distance from one of said end panels to minimize accumulation of particles on said one wafer placed into said first row of grooves, said distance is a function of a diameter of said one wafer multiplied by a predetermined value.

7. A device for carrying a plurality of semiconductor wafers according to claim 6 wherein said distance is a function of a diameter of said one wafer according to the following relationship:

$$L = 7\ mm\times[D(inch)/2]^2/16(inch^2)]$$

where D represents said diameter of said one wafer and L represents said distance.

* * * * *

UNITED STATES PATENT AND TRADEMARK OFFICE
CERTIFICATE OF CORRECTION

PATENT NO.   :   5,878,889
DATED        :   March 9, 1999
INVENTOR(S)  :   Takuya KOYANAGI It is certified that error appears in the above-identified patent and that said Letters Patent is hereby corrected as shown below:

On the title page item [73], contains a typographical error wherein "Nec Corporation" should read --NEC Corporation--.

Signed and Sealed this

Twenty-eighth Day of March, 2000

Attest:

Q. TODD DICKINSON

*Attesting Officer*    *Commissioner of Patents and Trademarks*